(12) United States Patent
Cheng et al.

(10) Patent No.: US 10,573,561 B2
(45) Date of Patent: Feb. 25, 2020

(54) FORMATION OF STACKED NANOSHEET SEMICONDUCTOR DEVICES

(71) Applicant: International Business Machines Corporation, Armonk, NY (US)

(72) Inventors: Kangguo Cheng, Schenectady, NY (US); Juntao Li, Cohoes, NY (US); Heng Wu, Guilderland, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/428,026

(22) Filed: May 31, 2019

(65) Prior Publication Data

US 2019/0393091 A1 Dec. 26, 2019

Related U.S. Application Data

(62) Division of application No. 16/018,696, filed on Jun. 26, 2018, now Pat. No. 10,388,569.

(51) Int. Cl.
*H01L 21/822* (2006.01)
*H01L 27/092* (2006.01)
(Continued)

(52) U.S. Cl.
CPC .. *H01L 21/8221* (2013.01); *H01L 21/823807* (2013.01); *H01L 21/823814* (2013.01);
(Continued)

(58) Field of Classification Search
CPC ......... H01L 21/8221; H01L 21/823807; H01L 21/823814; H01L 21/84; H01L 27/092; H01L 27/1203
See application file for complete search history.

(56) References Cited

U.S. PATENT DOCUMENTS 6,518,112 B2   2/2003  Armacost et al.
8,183,104 B2   5/2012  Hobbs et al.
(Continued)

OTHER PUBLICATIONS

Cheng, Kangguo et al., "Formation of Stacked Nano sheet Semiconductor Devices"; U.S. Appl. No. 16/018,696, filed Jun. 26, 2018.
(Continued)

*Primary Examiner* — Allan R Wilson
(74) *Attorney, Agent, or Firm* — Cantor Colburn LLP; Vazken Alexanian

(57) ABSTRACT

A method of fabricating a stacked semiconductor device includes forming nanosheet stacks including silicon layers and silicon germanium layers on a substrate. The method includes growing a first epitaxial layer on a source and drain and depositing an interlayer dielectric on the first epitaxial layer. The method includes etching the interlayer dielectric to expose the first epitaxial layer. The method includes etching a portion of the first epitaxial layer and growing a second epitaxial layer on the first epitaxial layer and etching the interlayer dielectric and depositing a first liner in a recess left by the etching, forming a pFET. The method includes etching a portion of the first liner and removing the second epitaxial layer leaving a portion of the first epitaxial layer exposed and depositing a second insulator layer on the first epitaxial layer, forming an nFET. The pFET and nFET are disposed adjacent to one another vertically.

19 Claims, 18 Drawing Sheets

(51) Int. Cl.
*H01L 27/12* (2006.01)
*H01L 21/84* (2006.01)
*H01L 21/8238* (2006.01)
*H01L 29/06* (2006.01)

(52) U.S. Cl.
CPC ............ *H01L 21/84* (2013.01); *H01L 27/092* (2013.01); *H01L 27/1203* (2013.01); *H01L 29/0673* (2013.01)

(56) References Cited

U.S. PATENT DOCUMENTS

| | | | |
|---|---|---|---|
| 8,216,902 | B2 | 7/2012 | Chang et al. |
| 8,466,451 | B2 | 6/2013 | Chang |
| 9,129,829 | B2 | 9/2015 | Kuhn et al. |
| 9,472,558 | B1 | 10/2016 | Cheng et al. |
| 9,490,323 | B2 | 11/2016 | Rodder et al. |
| 9,583,491 | B2 | 2/2017 | Kim et al. |
| 9,711,414 | B2 | 7/2017 | Hatcher et al. |
| 9,773,913 | B1 | 9/2017 | Balakrishnan |
| 9,871,140 | B1 | 1/2018 | Balakrishnan et al. |
| 10,096,607 | B1 | 10/2018 | Guillorn |
| 10,192,867 | B1 | 1/2019 | Frougier |
| 10,236,217 | B1 | 3/2019 | Ando |
| 2010/0295021 | A1 | 11/2010 | Chang |
| 2011/0031473 | A1* | 2/2011 | Chang .............. B82Y 10/00 257/24 |
| 2016/0086951 | A1 | 3/2016 | Kim |
| 2016/0211276 | A1 | 7/2016 | Liu |
| 2017/0005106 | A1* | 1/2017 | Zhang ............. H01L 29/42392 |
| 2017/0012046 | A1* | 1/2017 | Ching ............... H01L 29/16 |
| 2017/0018462 | A1 | 1/2017 | Suk |
| 2017/0323953 | A1 | 11/2017 | Cheng et al. |
| 2018/0047832 | A1 | 2/2018 | Tapily |
| 2019/0131396 | A1* | 5/2019 | Zhang ............. H01L 29/0673 |

OTHER PUBLICATIONS

Cheng, Kangguo et al., "Vertically Stacked Transistors"; U.S. Appl. No. 16/018,710, filed Jun. 26, 2018.

List of IBM Patents or Patent Applications Treated as Related; (Appendix P), Filed May 31, 2019, 2 pages.

Ming-Long Fan et al., "Stability and performance optimization of heterochannel monolithic 3-D SRAM cells considering interlayer coupling," IEEE Transactions on Electron Devices, vol. 61, No. 10, 2014, pp. 3448-3455.

* cited by examiner

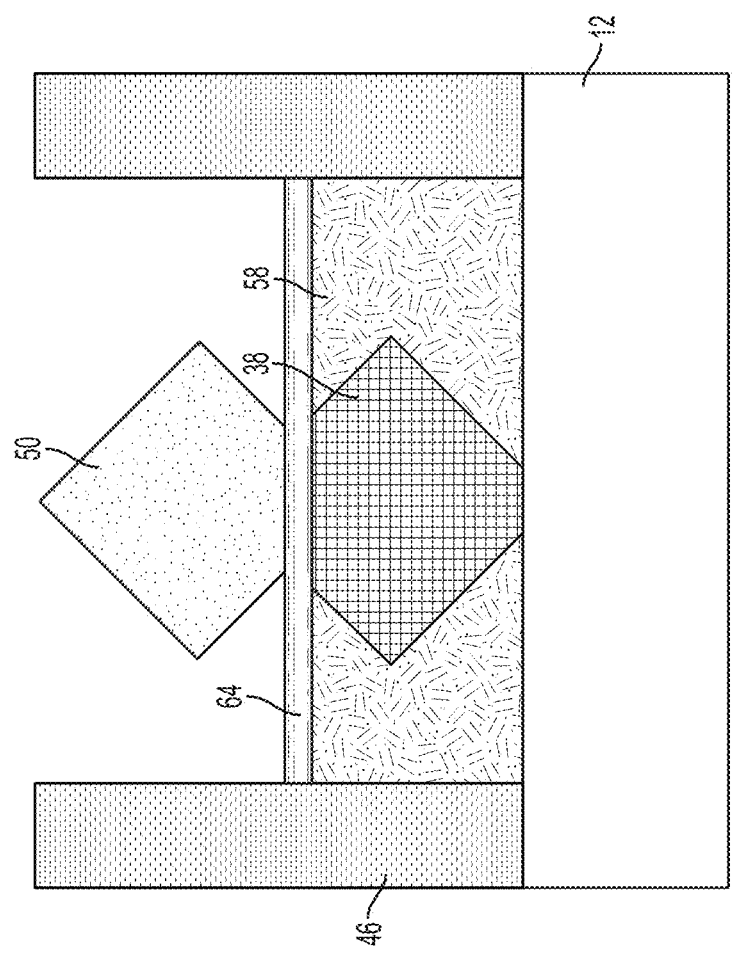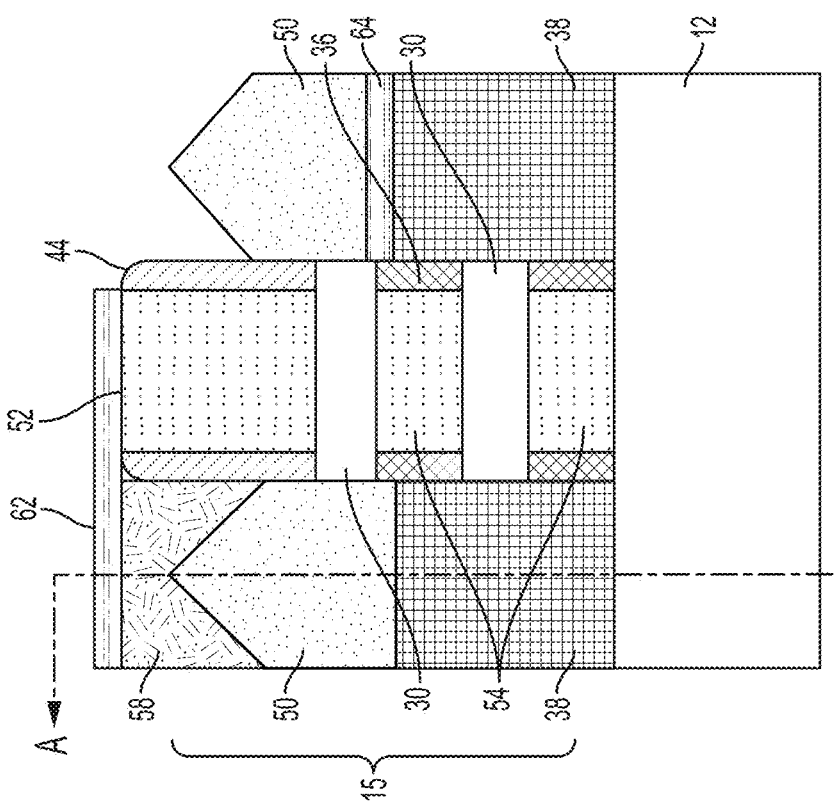

U.S. 10,573,561 B2

FORMATION OF STACKED NANOSHEET SEMICONDUCTOR DEVICES

DOMESTIC PRIORITY

This application is a divisional of U.S. application Ser. No. 16/018,696, titled "FORMATION OF STACKED NANOSHEET SEMICONDUCTOR DEVICES" filed Jun. 26, 2018, the contents of which are incorporated by reference herein in its entirety.

BACKGROUND

The present invention generally relates to fabrication methods and resulting structures for semiconductor devices. More specifically, the present invention relates to the formation of stacked nanosheet semiconductor devices.

As semiconductor integrated circuits (ICs) or chips become smaller, the implementation of stacked nanosheets in semiconductor devices has increased. Nanosheet transistors are non-planar semiconductor devices that utilize two-dimensional nanostructures (e.g., nanosheets or nanowires) with a thickness range on the order of about 1 nanometer (nm) to about 100 nm. Nanosheet transistors have a reduced footprint compared to conventional planar-type semiconductor devices. Accordingly, nanosheet transistors are seen as an option for reducing the footprint of semiconductor devices to 7 nanometers and beyond.

SUMMARY

Embodiments of the present invention are directed to a method for fabricating a stacked nanosheet semiconductor device. A non-limiting example of the method includes forming nanosheet stacks including alternating silicon layers and silicon germanium layers on a substrate. The method further includes growing a first epitaxial layer on a source and drain and on an interlayer dielectric on the first epitaxial layer. The method further includes partially etching the interlayer dielectric to expose a portion of the first epitaxial layer. The method further includes selectively etching a portion of the first epitaxial layer and growing a second epitaxial layer on the first epitaxial layer and etching a portion of the interlayer dielectric and depositing a first metal layer in a space left by the etching, forming a pFET. The method further includes selectively etching a portion of the first metal layer and selectively removing a portion of the second epitaxial layer leaving a portion of the first epitaxial layer exposed and depositing a second metal layer on the first epitaxial layer, forming an nFET. The method further includes the pFET and the nFET being vertically stacked and separated by the first epitaxial layer.

Embodiments of the present invention are directed to a semiconductor device. A non-limiting example of the semiconductor device includes a nanosheet semiconductor device including a pFET and an nFET. The pFET and the nFET are vertically stacked on one another.

Embodiments of the present invention are directed to a method of operating a nanosheet semiconductor device. The method includes transporting a current laterally through the nanosheet semiconductor device. A pFET and an nFET of the nanosheet semiconductor device are vertically stacked.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 16A depicts cross-sectional view of the semiconductor device after the growth of a second epitaxy layer;

FIG. 16B depicts a cross-sectional view of the semiconductor device of FIG. 16A taken along line A-A;

Figure 1:
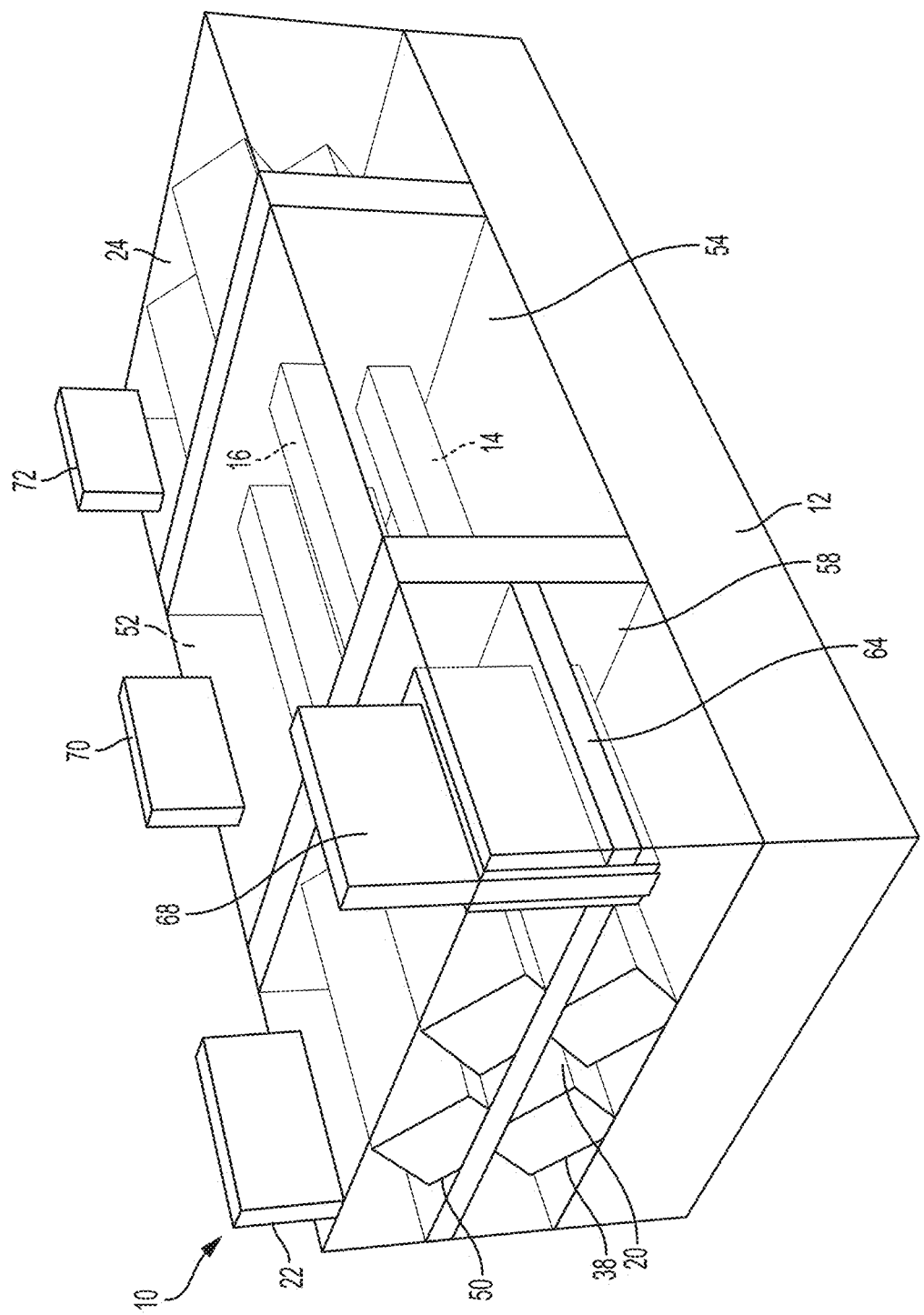
FIG. 1 depicts a three-dimensional cross-sectional view of a semiconductor device after a fabrication operation according to embodiments of the invention.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details. Turning now to an overview of technologies that are more specifically relevant to aspects of the invention, nanosheet semiconductor devices typically include one or more suspended nanosheets that serve as the channel. An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. As fabrication trends aim to continue reducing the footprints of semiconductor devices, the total contact area between the upper surface of the source/drain epitaxy structure and the lower surface of the metal source/drain contact is reduced. As a result, the overall resistance in the source/drain region increases, which can reduce the overall performance of the device.

Turning now to an overview of aspects of the invention, one or more embodiments of the invention address the above-described shortcomings by providing a nanosheet FET including vertically stacked p-type nanosheet MOSFET (pFET) and n-type nanosheet MOSFET (nFET) within the nanosheet FET. The stacking of the pFETs and nFETs as disclosed herein is based on three-dimensional nanosheet transistors, as opposed to planar devices, which require wafer bonding in order to realize the stacking. Within this nanosheet FET with vertical stacking of the pFET and the nFET, the drain of the pFET and the drain of the nFET are electrically connected, while the source of the pFET and the source of the nFET are electrically isolated. With this vertically stacked three-dimensional nanosheet, a higher density can be realized. With a higher density, more devices can be placed on the nanosheet, i.e., more transistors can be placed per chip equating to overall lower cost per transistor. The vertically stacked three-dimensional nanosheet disclosed herein can provide better gate control over the channel as well as a larger effective channel width (Weff) to conduct the current. The method described herein utilizes a top-down approach to enable formation of the vertically stacked three-dimensional nanosheet. Top-down generally refers to a miniature device being produced by starting with something larger and removing pieces until the final structure is achieved. Further, with the nanosheet FET disclosed herein, current travels laterally across the nanosheet FET. It is noted that vertically stacking the pFET and nFET in the nanosheet allow reductions in the area size of the nanosheet. An epitaxial etch back process can be used to grow epitaxy layers in desired regions and then a metal etch back process can be used to isolate the pFET and nFET produced and allow the pFET and nFET to be vertically stacked on a three-dimensional nanosheet.

In this manner, the shortcomings addressed above can be overcome by providing a nanosheet with reduced area scaling by as much as half, but with increased density. Area scaling assists in reducing the cost and increasing the integration density. This is important since nanosheets are one of the most promising technologies in the 5 nanometers and beyond technology node.

Turning now to a more detailed description of aspects of the present invention, FIG. 1 depicts a semiconductor device 10 according to embodiments of the invention. In FIG. 1, the semiconductor device is a three-dimensional vertically stacked semiconductor device 10 based on a three-dimensional nanosheet. As shown in FIG. 1, by vertically stacking the nanosheet semiconductor device 10, the area can be reduced greatly, by even as much as half as compared to a semiconductor device without vertical stacking. As shown in FIG. 1, a semiconductor device 10 includes a substrate 12 with vertically stacked pFETs 14 and nFETs 16. A source 20, ground 22, and drain 24 are also shown as part of the semiconductor device 10.

In the formed nanosheet stacked semiconductor device 10, the pFET 14 and the nFET 16 are vertically stacked on one another, thereby decreasing the overall area needed for the semiconductor device 10. As can be seen in FIG. 1, the pFET 14 and the nFET 16 share the same gate 52 and the same drain 24. In FIG. 1, the pFET 14 source is connected to a voltage drain drain ($V_{DD}$) 68 and the nFET 16 source is connected to the ground 22. An insulator layer, i.e., a second insulator layer 64, is dispersed between the source of the pFET and the nFET. A first epitaxy layer 38 and a second epitaxy layer 50 are dispersed on either side of the second insulator layer 64. An input 70 and output 72 are also shown in FIG. 1 along with the voltage drain drain metal (VDD) 68 connecting to the bottom source 20. A first liner 58 surrounds a portion of the source, first epitaxy layer 38, and second epitaxy layer 50, while a work function metal (WFM) layer 54 is disposed around the pFET 14 and nFET 16.

Figure 2:
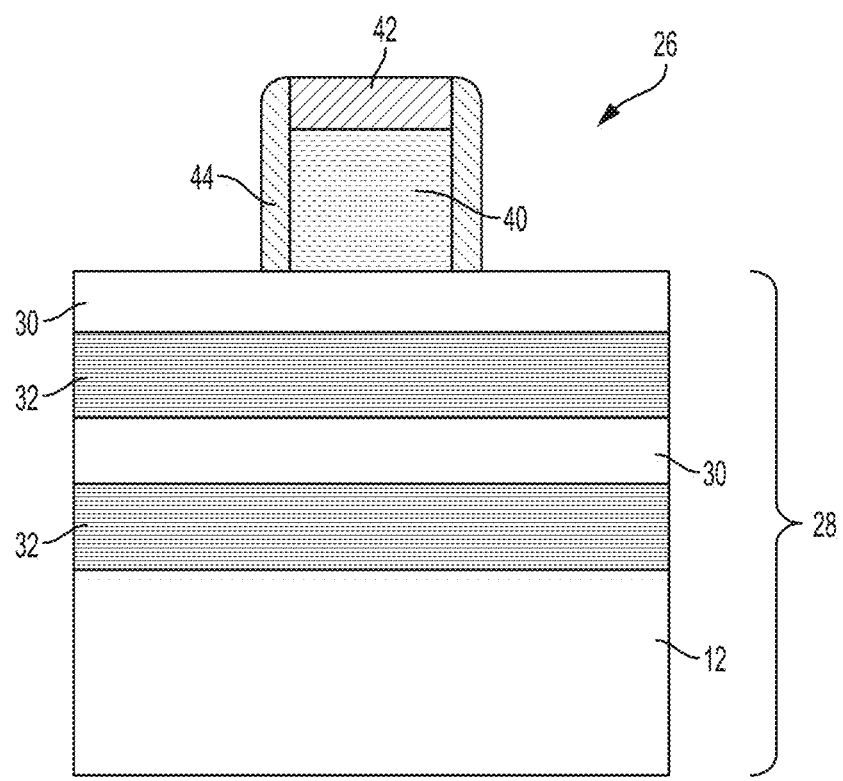
FIG. 2 depicts a cross-sectional view of a semiconductor device at an intermediate stage of a semiconductor fabrication process flow.

Turning now to FIG. 2 to FIG. 17B, a non-limiting vertically stacked three-dimensional nanosheet FET fabrication process flow is described. In FIG. 2, known semiconductor fabrication operations have been used to form the depicted intermediate semiconductor structure. As shown in FIG. 2, a gate structure 26 is patterned on a stack 28 that includes silicon (Si) layers 30 and silicon germanium (SiGe) layers 32. The stack 28 is patterned on the substrate 12 with alternating silicon layers 30 and silicon germanium layers 32. The substrate 12 is shown as a bulk semiconductor substrate which can be implemented as a semiconductor-on-insulator substrate (SOI). The substrate 12 can include a buried insulator layer (not shown) such as a buried oxide layer (BOX). The substrate 12 is composed of silicon (Si) and the optional BOX layer is composed of silicon oxide ($SiO_2$).

The stack 28 is formed as an alternating stack of silicon germanium layers 32 and silicon layers 30. Multiple epitaxial growth processes can be performed to form the silicon germanium layers 32 and silicon layers 30. In embodiments of the invention where the substrate 12 is implemented as an SOI structure, to achieve a silicon germanium layer 32 directly on the upper surface of the substrate 12, for example, a SiGe layer is first epitaxially grown on an upper surface of an initial SOI layer (not shown). Thereafter, the SiGe layer is condensed using a thermal oxidation process, for example, that results in the Si in the SiGe layer being consumed (by the oxidation process) while the Ge is driven down into the initial SOI layer (not shown). The thermal oxidation process includes, for example, exposing the initial SiGe layer to a temperature of about 900° Celsius (C) to about 1,200° C., e.g., about 1,100° C. for a duration of about 5 minutes to about 15 minutes, in $O_2$.

It should be appreciated that the alternating series of SiGe layers 32 and Si layers 30 can be either relaxed or strained. For example, if grown to a certain thickness or with a low Ge concentration, the layers 30 and 32 will be relaxed due to dislocation defects. However, increasing the concentration of Ge, for example, can strain the alternating series of SiGe layers 32 and Si layers 30.

The gate structure 26 includes a sacrificial (or dummy) gate material 40, a hardmask cap 42, and opposing gate spacers 44. The sacrificial gate material 40 can be composed, for example, of polysilicon (PolySi). Although not illustrated, the gate structure 26 can also include a sacrificial dummy gate dielectric interposed between the stack 28 and the sacrificial gate material 40. When present, the sacrificial dummy gate dielectric can be composed of various oxide materials including, but not limited to, SixOyHz. The height of the sacrificial gate material 40 (including the dummy gate dielectric, if present) can be, for example, from about 20 nanometers (nm) to about 100 nm.

The hardmask cap 42 is formed on an upper surface of the sacrificial gate material 40. The hardmask cap 42 can be composed of various nitride materials including, but not limited to, silicon nitride (SiN). The gate spacers 44 are formed on opposing outer sidewalls of the sacrificial gate material 40 and the hardmask cap 42. The gate spacers 44 can be composed of SiBCN, which allows the stack 28 to be etched with respect to the gate structure 26 as described in greater detail below. SiBCN also has a dielectric constant (k) that is less than conventional SiN spacers. Accordingly, the overall capacitance of the gate structure 26 can be reduced compared to conventional gate structures.

Figure 3:
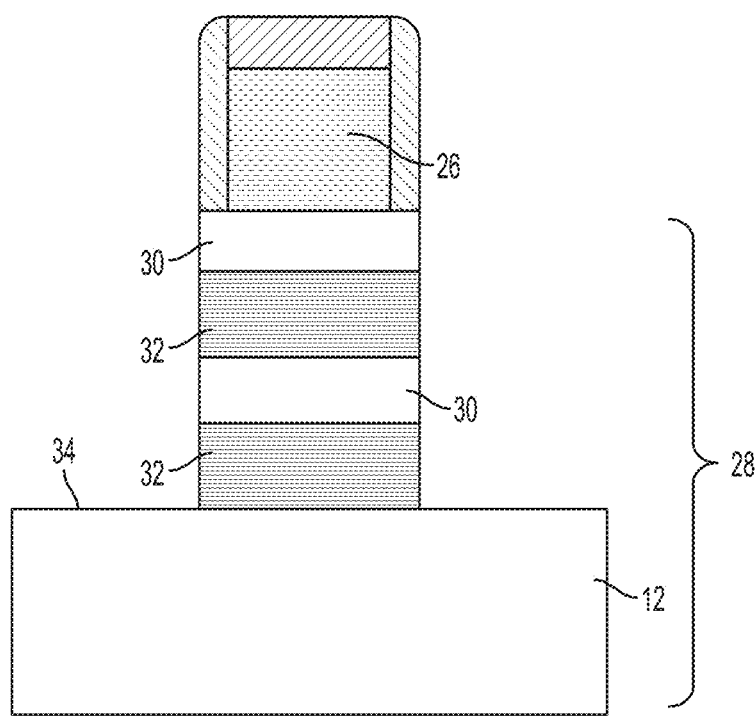
FIG. 3 depicts a cross-sectional view of the semiconductor device of FIG. 2 following a source/drain (S/D) recess process.
Figure 4:
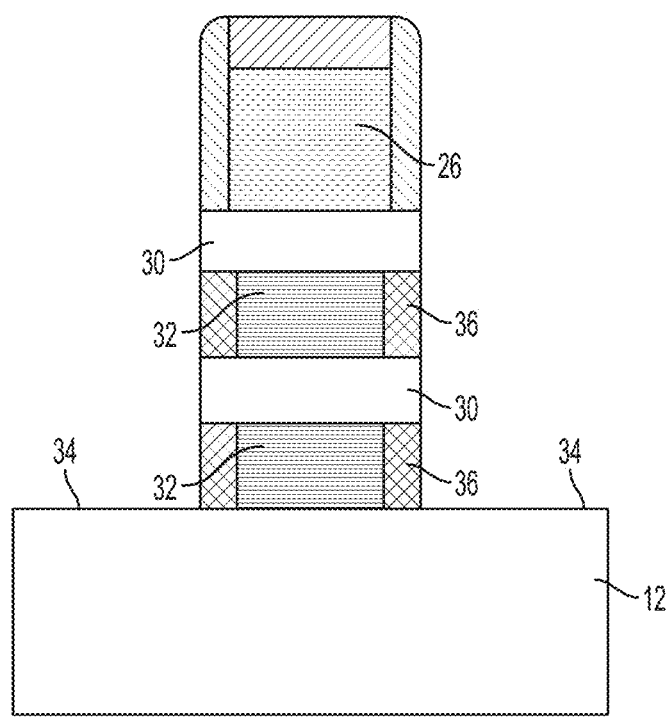
FIG. 4 depicts a cross-sectional view of the semiconductor device following the formation of inner spacers.

In FIG. 3, portions of the stack 28 not covered by the gates structure 26 are etched away to form recesses 34. Epitaxial regions 38 (e.g., a first epitaxy layer 38) are formed in the recesses (see FIG. 5). The epitaxial regions 38 will function as a source 20 and drain 24 (see FIG. 1), while in FIG. 4, inner spacers 36 are formed on the silicon germanium layers 32. Recesses (not shown) can be formed in end regions of the silicon germanium layer 32 and filled with a dielectric material to from the inner spacers 36. The dielectric material can include SiN, for example, and can be deposited according to a conformal deposition processes (not shown) that applies a conformal dielectric layer along the outer sides of the stack 28 and the upper surface of the substrate 12. An atomic layer deposition (ALD) process can be performed to achieve the conformal deposition of the dielectric material. In this manner, the dielectric material fills recesses in end regions of the silicon germanium layers 32 to form the inner spacers 36.

Figure 5:
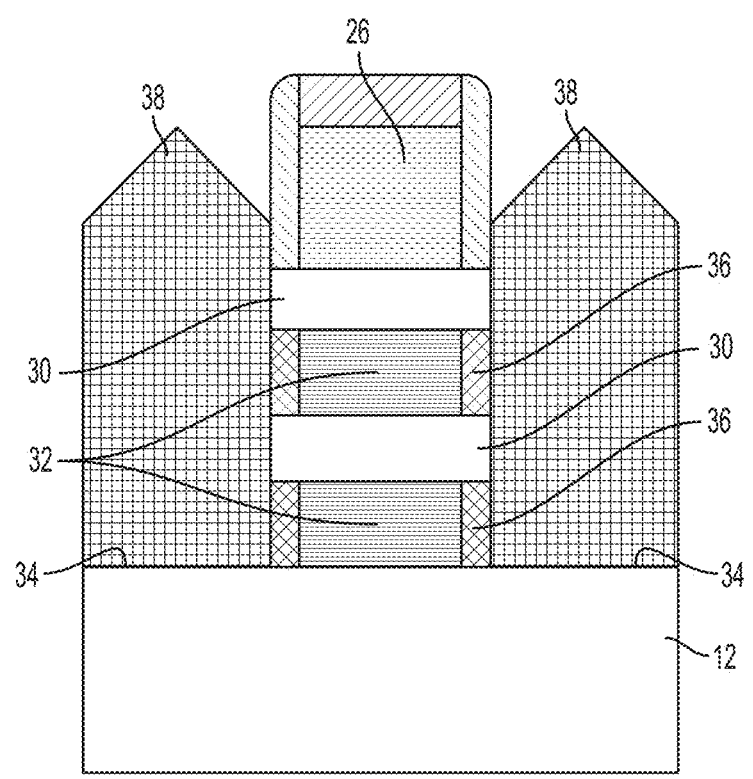
FIG. 5 depicts a cross-sectional view of the semiconductor device following a first epitaxy (epi) growth.

A first epitaxy layer 38 is grown on the recesses 34 in FIG. 5. The first epitaxy layer 38 can function as the source or drain and thus can also be termed an epitaxially grown source/drain (S/D) region 38. The first epitaxy layer 38 can include silicon, silicon germanium, pure silicon, or a combination including at least one of the foregoing. Pure silicon as described herein generally refers to silicon epitaxy with in-situ P doping. The silicon germanium layers 32 have a vertical thickness of, for example, approximately 3 nm to approximately 10 nm. The silicon layers 30 have a vertical thickness of, for example, approximately 3 nm to approximately 10 nm. Although four layers are illustrated, it should be appreciated that the stack 28 can include any number (n) of layers.

The first epitaxial layer 38 can be doped to form a p-type semiconductor device or an n-type semiconductor device. When forming a p-type semiconductor device, the active semiconductor layers can be doped with, for example, phosphorus (P) or arsenic (As). When forming an n-type semiconductor device, the active semiconductor layers 114 can be doped with, for example, boron (B) or gallium (Ga). An annealing process (not shown) can be performed to activate the dopants implanted in the first epitaxial layer 38.

Figure 6A:
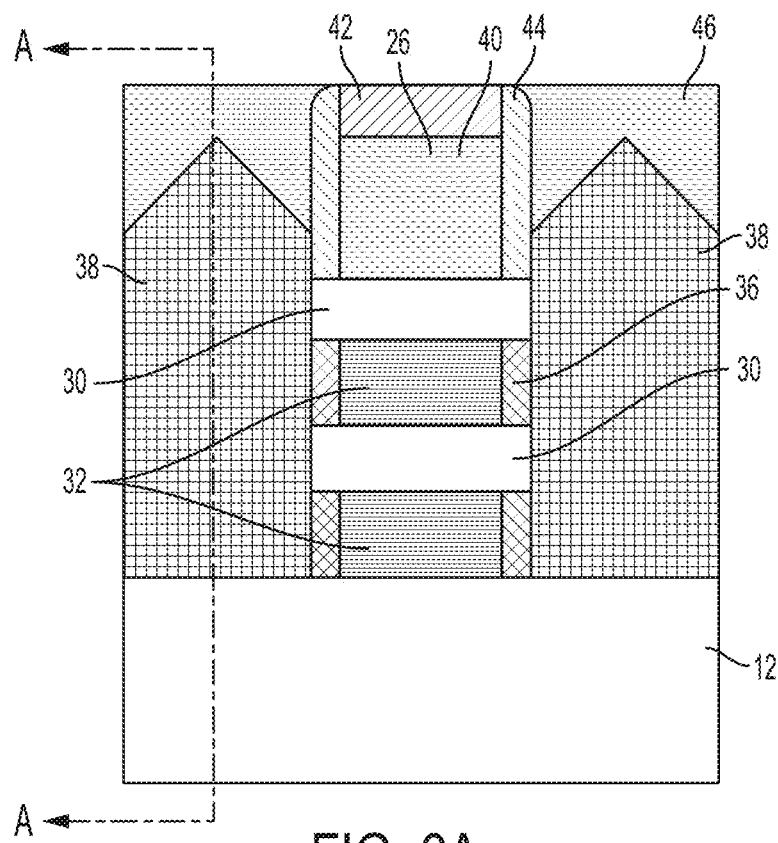
FIG. 6A depicts a cross-sectional view of the semiconductor device the formation of a dielectric layer surrounding the epi.
Figure 6B:
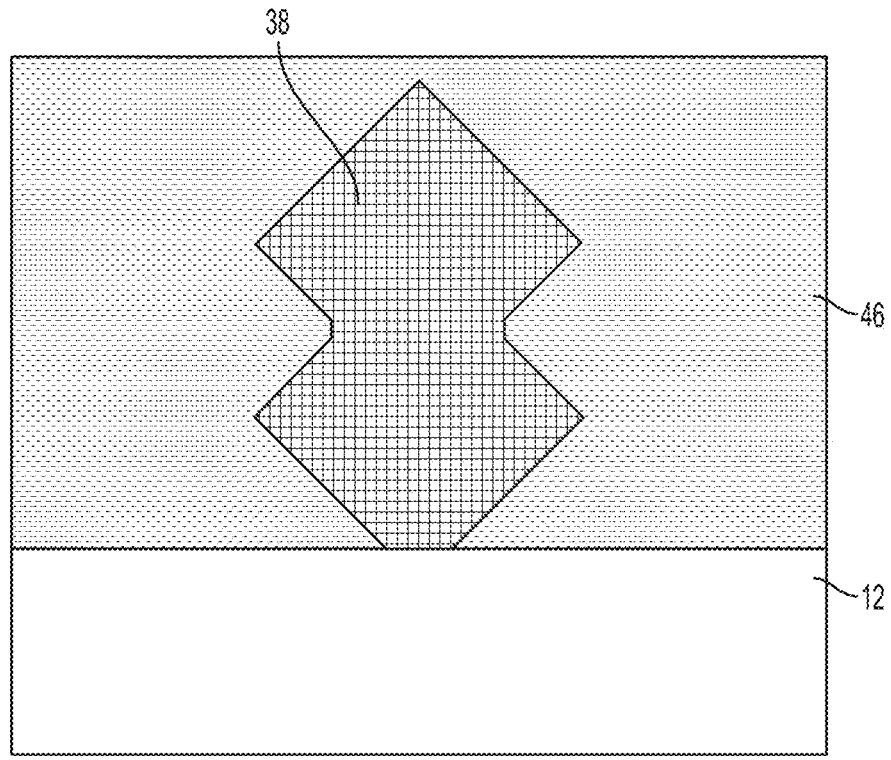
FIG. 6B depicts a cross-sectional view of the semiconductor device of FIG. 6A taken along line A-A.

Referring now to FIGS. 6A and 6B, a deposition and chemical mechanical planarization (CMP) process has been utilized to deposit and planarize a dielectric layer 46 surrounding the first epitaxy layer 38 (e.g., an interlayer dielectric (ILD) region 46). FIG. 6B illustrates a cross-sectional view of FIG. 6A taken along line A-A. The ILD 46 is composed of a flowable oxide material such as polymer hydrogen silsesquioxane (HSQ) solution in methyl isobutyl ketone (MIBK), for example, and can be deposited on an upper surface of the substrate 12 (best shown in FIG. 6B) to completely cover or encapsulate the first epitaxy layer 38. In one more embodiments of the invention, a subsequent planarization process (not shown) can be performed. The planarization process can be selective to the ILD 46 so that the process stops on the upper surface of the gate cap 42 and spacers 44. In this manner, the upper surface of the ILD 46 can be flush (i.e., co-planar) with respect to the upper surface of the gate cap 42 and the spacers 44 as further illustrated in FIG. 6A.

Figure 7A:
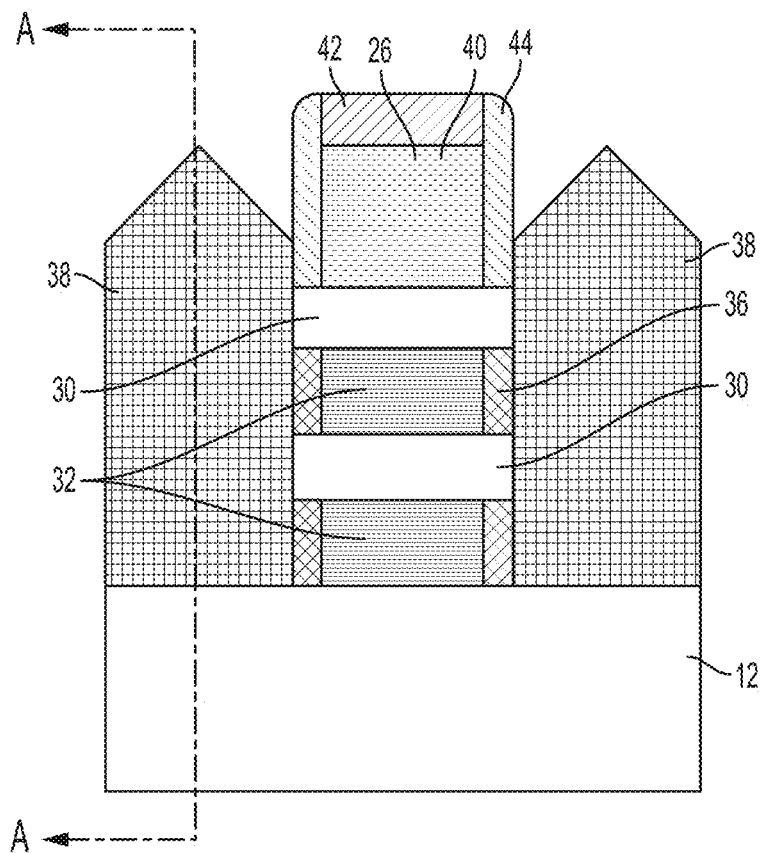
FIG. 7A depicts a cross-sectional view of the semiconductor device with the surrounding dielectric layer partially etched away.
Figure 7B:
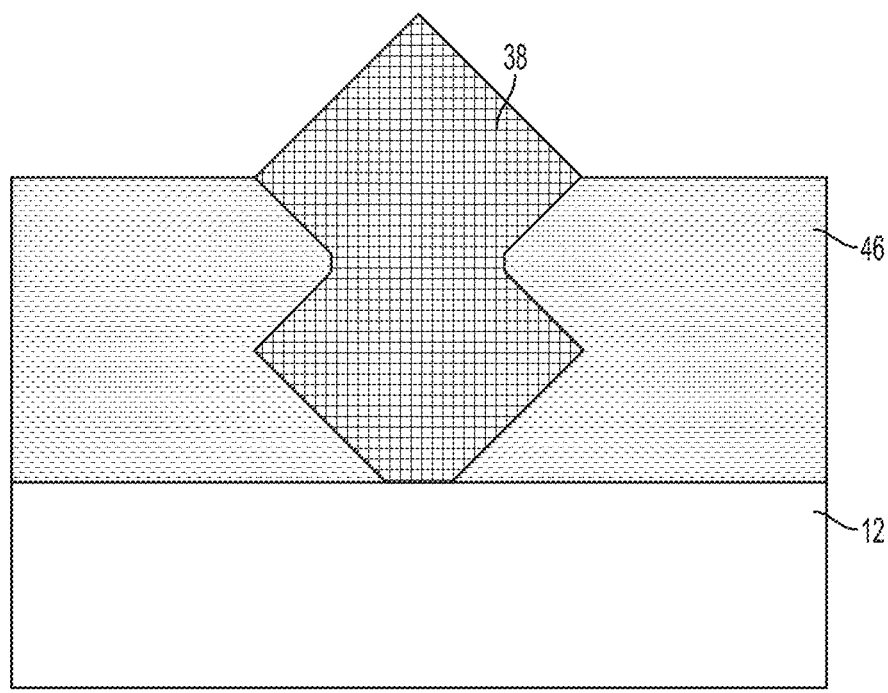
FIG. 7B depicts a cross-sectional view of the semiconductor device of FIG. 7A taken along line A-A.

FIGS. 7A and 7B depict an etching operation. As best shown in FIG. 7B, which illustrates a cross-sectional view of FIG. 7A taken along line A-A, a portion of the ILD 46 has been partially etched to expose a top portion of the first epitaxy layer 38, while preserving the gate structure 26, the inner spacers 36, the silicon layers 30, and the silicon germanium layers 32 (best shown in FIG. 7A).

Figure 8A:
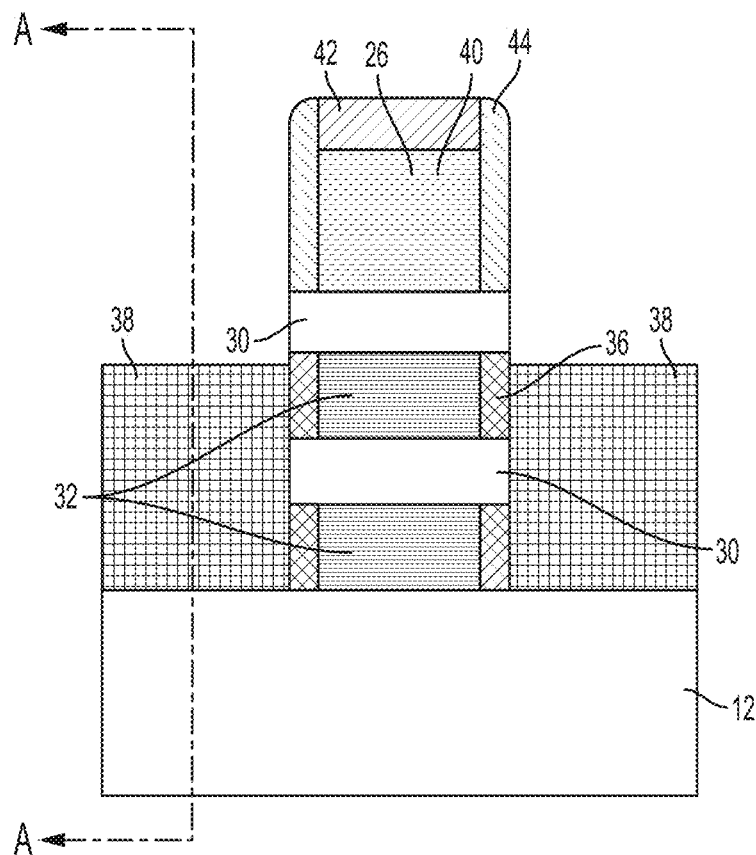
FIG. 8A depicts cross-sectional view of the semiconductor device after a partial etching process of the first epitaxy layer.
Figure 8B:
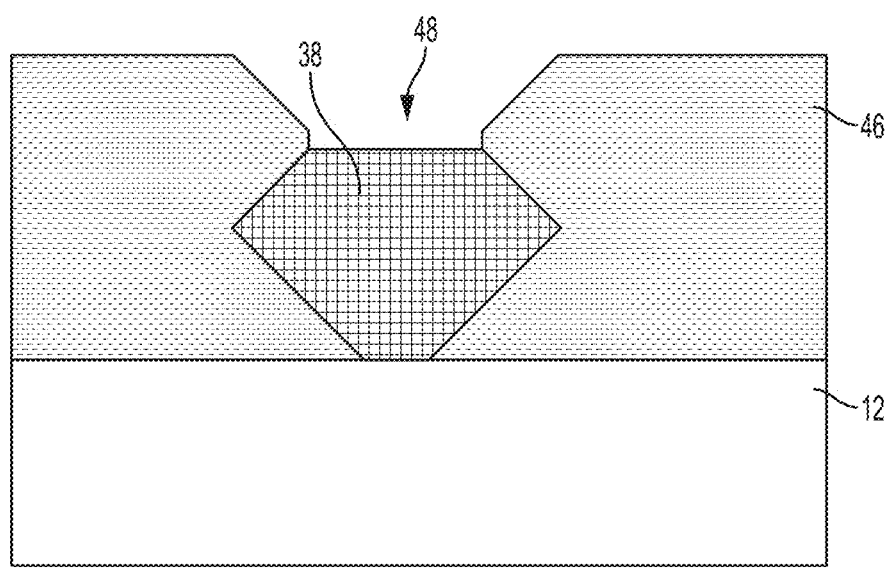
FIG. 8B depicts a cross-sectional view of the semiconductor device of FIG. 8A taken along line A-A.

In FIGS. 8A and 8B, selective etching has been used to remove the exposed portions of the first epitaxy layer 38 leaving a recess 48 (best shown in FIG. 8B, which illustrates a cross-sectional view of FIG. 8A taken along line A-A).

Figure 9A:
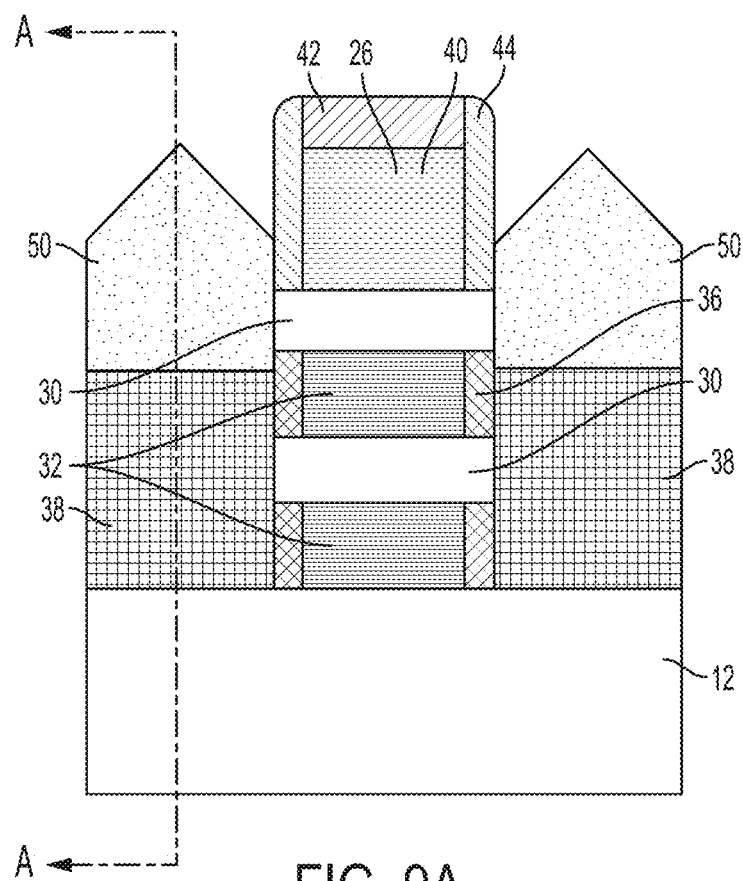
FIG. 9A depicts cross-sectional view of the semiconductor device after growth of a second epitaxy layer.
Figure 9B:
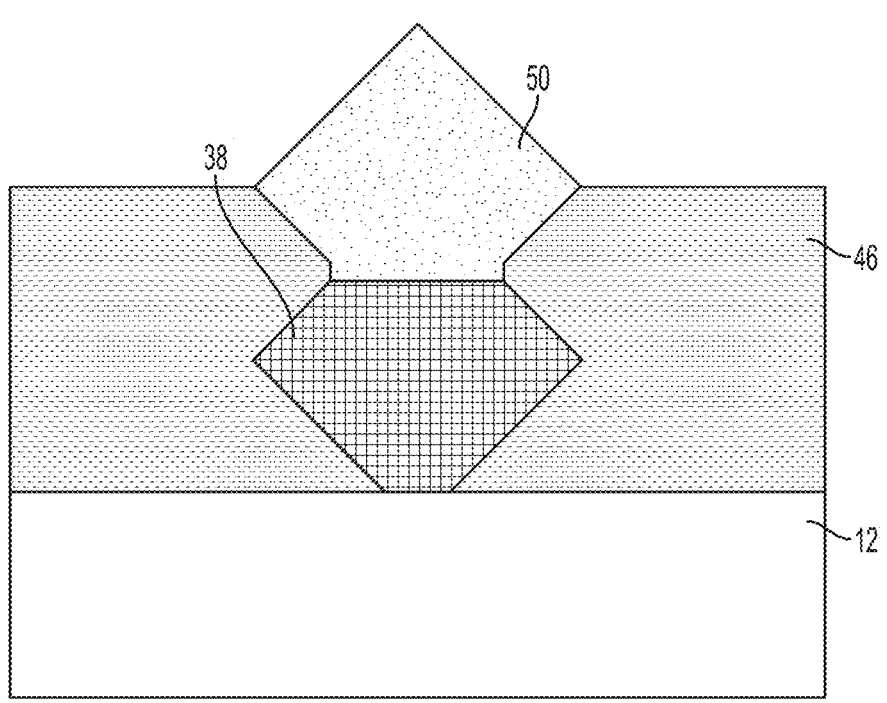
FIG. 9B depicts a cross-sectional view of the semiconductor device of FIG. 9A taken along line A-A.

In FIGS. 9A and 9B, a second epitaxial layer 50 has been grown in the recess 48 left by the on the first epitaxial layer 38 (best shown in FIG. 9B, which illustrates a cross-sectional view of FIG. 9A taken along line A-A). The etching process can be a selective reaction ion etching process that removes only a portion of the ILD 46, leaving the gate structure 26 untouched. The second epitaxy layer 50 can include silicon, silicon germanium, or pure silicon epitaxy (SiP), which is silicon epitaxy with in-situ p doping.

Figure 10A:
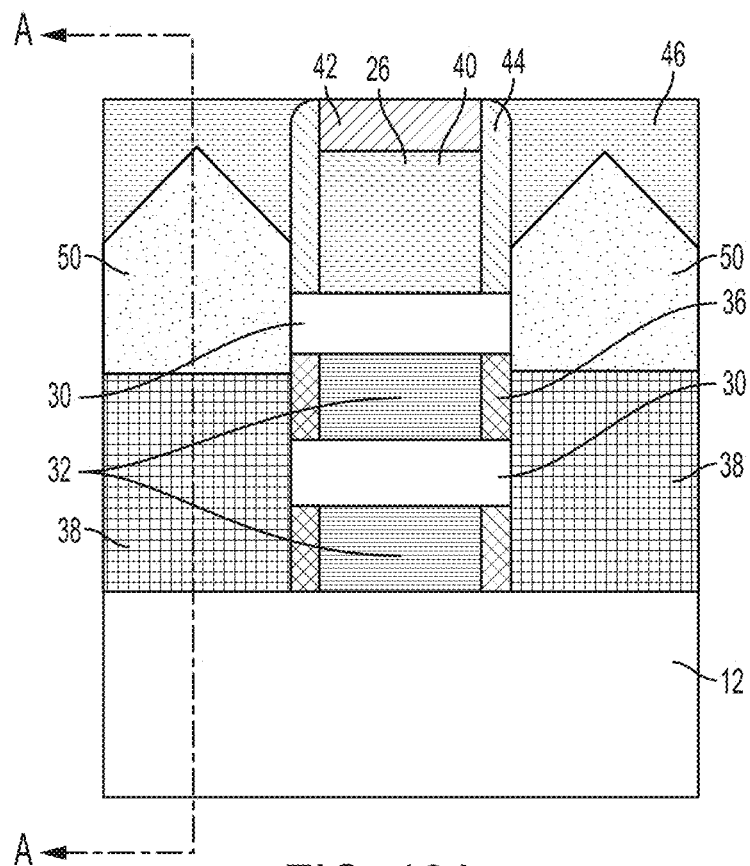
FIG. 10A depicts a cross-sectional view of the semiconductor device after an dielectric layer\refill process.
Figure 10B:
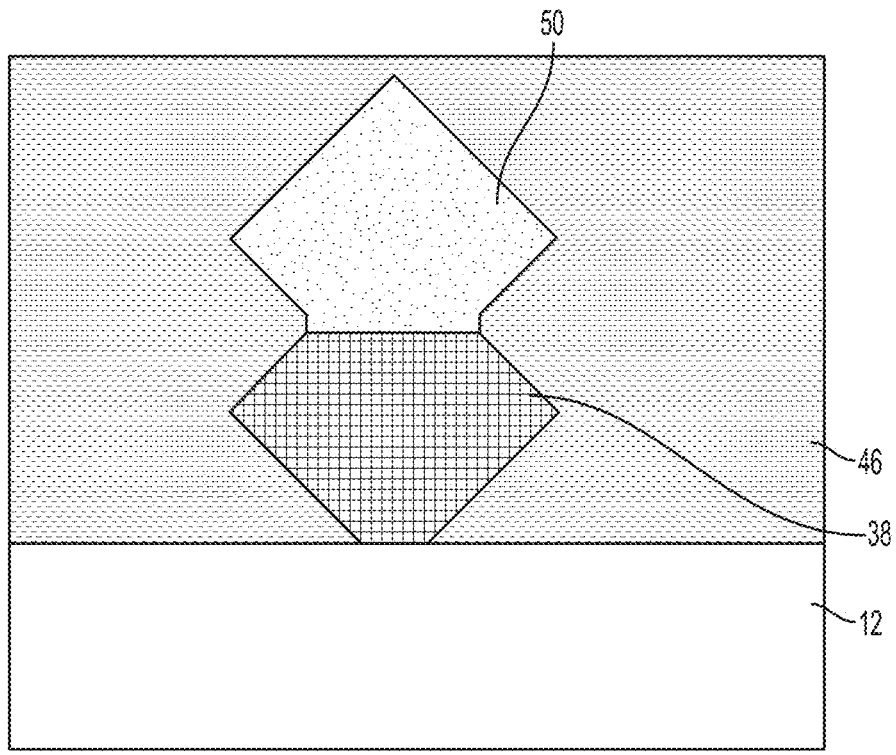
FIG. 10B depicts a cross-sectional view of the semiconductor device of FIG. 10A taken along line A-A.

In FIGS. 10A and 10B, the IDL 46 is refilled to cover the second epitaxial layer 50 (best shown in FIG. 10B, which illustrates a cross-sectional view of FIG. 10A taken along line A-A). The ILD 46 can be a flowable oxide material such as polymer hydrogen silsesquioxane (HSQ) solution in methyl isobutyl ketone (MIBK), for example, and can be deposited on an upper surface of the substrate 12 to completely cover or encapsulate the first epitaxy layer 38 (as best shown in FIG. 10B). In one more embodiments of the invention, a subsequent planarization process (not shown) can be performed. The planarization process can be selective to the ILD 46 so that the process stops on the upper surface of the gate cap 42 and spacers 44. In this manner, the upper surface of the ILD 46 can be flush (i.e., co-planar) with respect to the upper surface of the gate cap 42 and the spacers 44 as further illustrated in FIG. 10A.

Figure 11A:
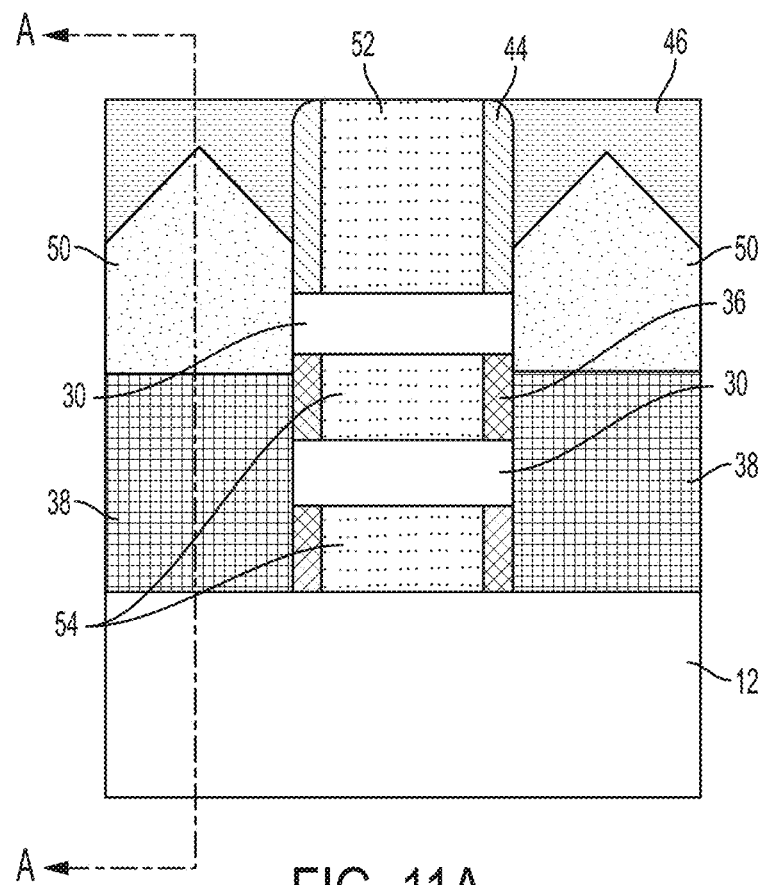
FIG. 11A depicts cross-sectional view of the semiconductor device after a replacement metal gate process.
Figure 11B:
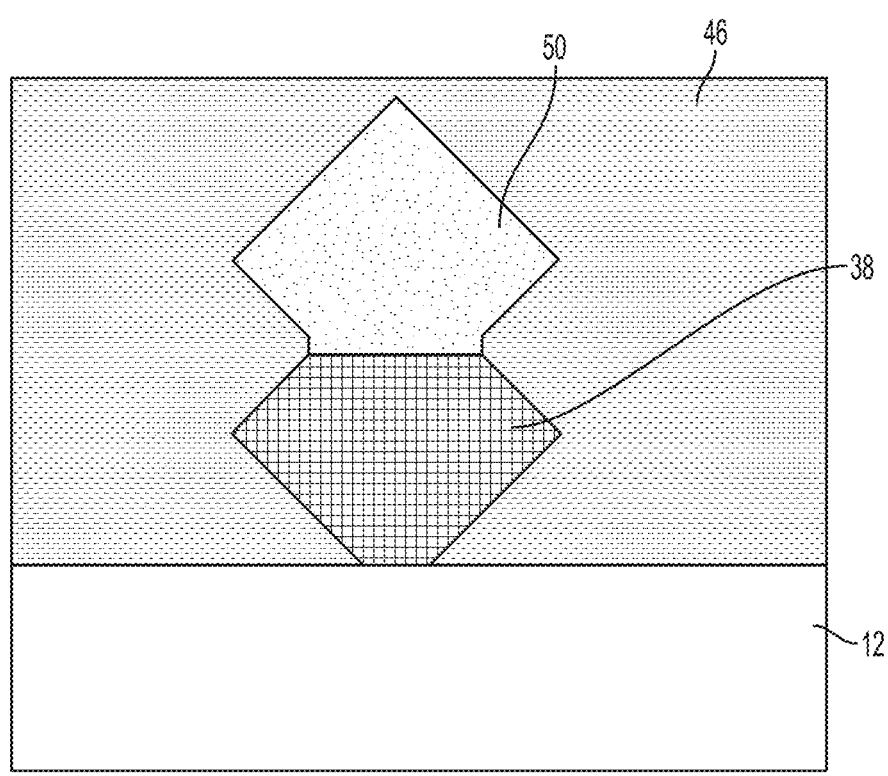
FIG. 11B depicts a cross-sectional view of the semiconductor device of FIG. 11A taken along line A-A.

In FIGS. 11A and 11B, a pull down of the sacrificial gate material 40 and the hardmask cap 42 has been performed to allow the formation of a gate replacement structure 52 is shown. Additionally, the sacrificial SiGe layers 32 were removed with a selective etching process and replaced with metal layers, such as work function metal layers 54. The gate replacement structure 52 includes an electrically conductive material composed of tungsten (W) or aluminum (Al), for example, which can be deposited after the pull down according to a chemical vapor deposition (CVD) process. One or more work function metal layers 54 can be deposited prior to depositing the gate replacement structure 52. The work function metal layers 54 can include layers of titanium nitride or TiAlC (depending upon the type of transistor device being manufactured).

Figure 12A:
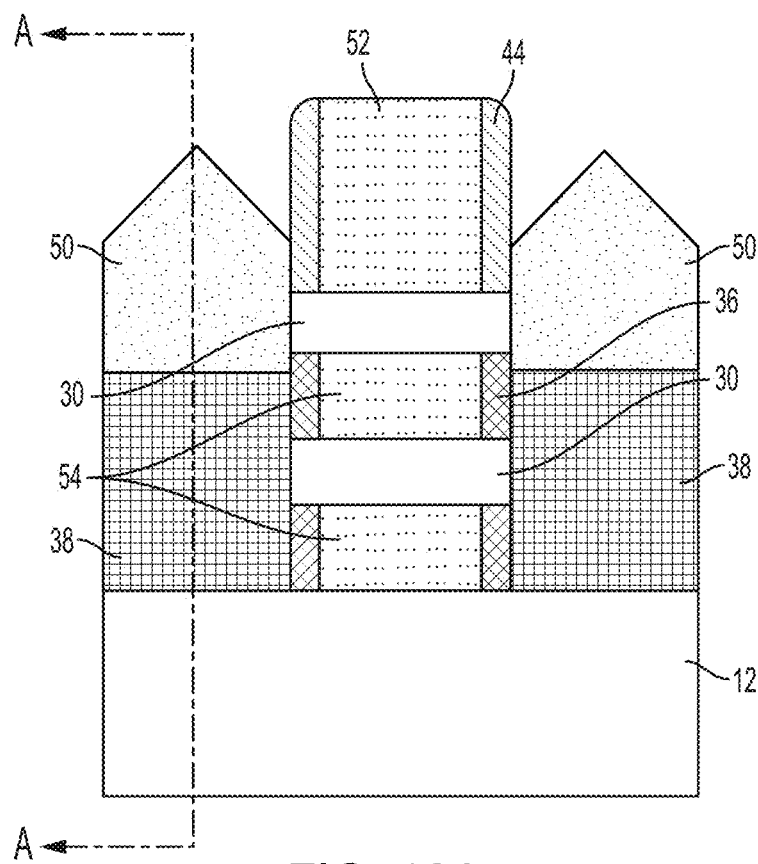
FIG. 12A depicts cross-sectional view of the semiconductor device after another surrounding dielectric etching process.
Figure 12B:
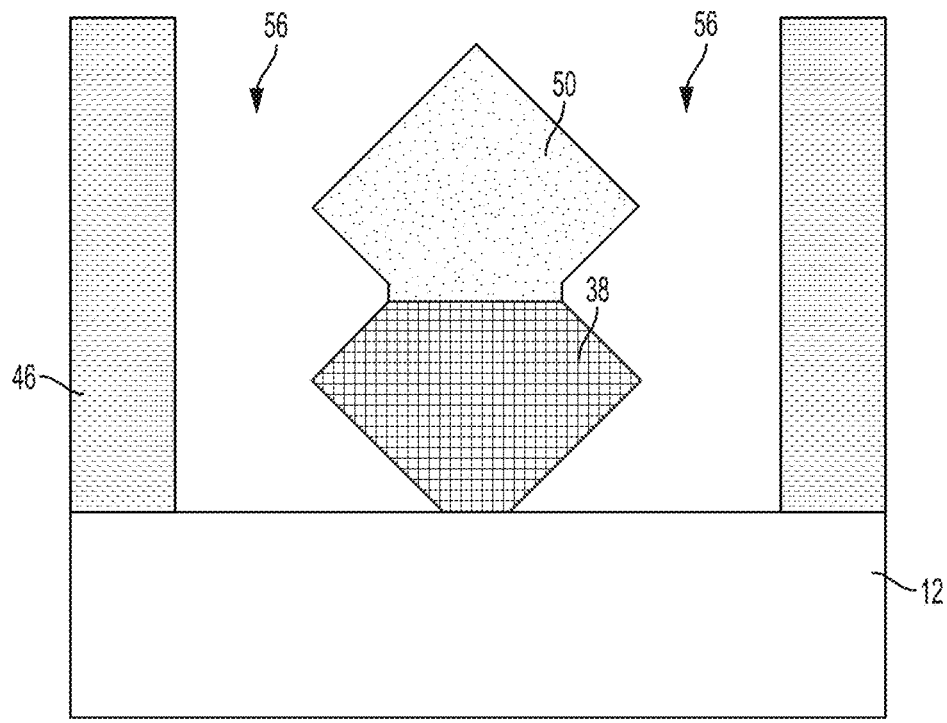
FIG. 12B depicts a cross-sectional view of the semiconductor device of FIG. 12A taken along line A-A.

In FIGS. 12A and 12B, a selective etching process, for example, a selective reactive ion etching process has been used to etch a portion of the ILD 46 from the first epitaxial layer 38 and the second epitaxial layer 50 to form source and drain trenches 56 (best shown in FIG. 12B, which illustrates a cross-sectional view of FIG. 10A taken along line A-A). The source and drain trenches 56 have a width of, for example, about 5 nm to about 15 nm. The etching process is selective to the ILD 46 so that the ILD 46 is partially removed without attacking any other features of the device.

Figure 13A:
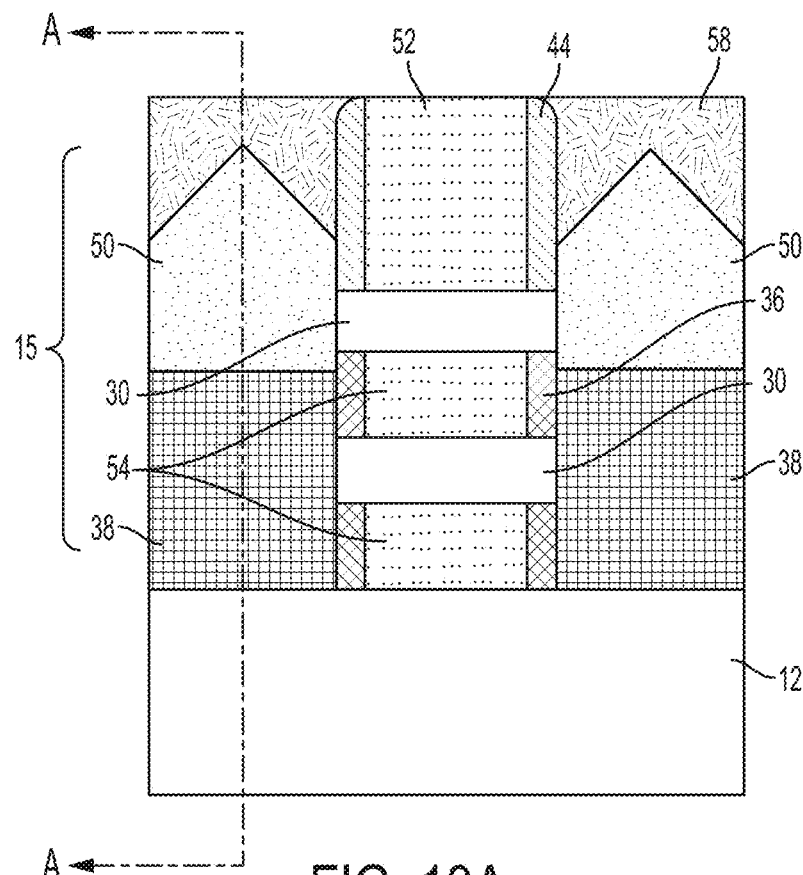
FIG. 13A depicts a cross-sectional view of the semiconductor device after metal deposition.
Figure 13B:
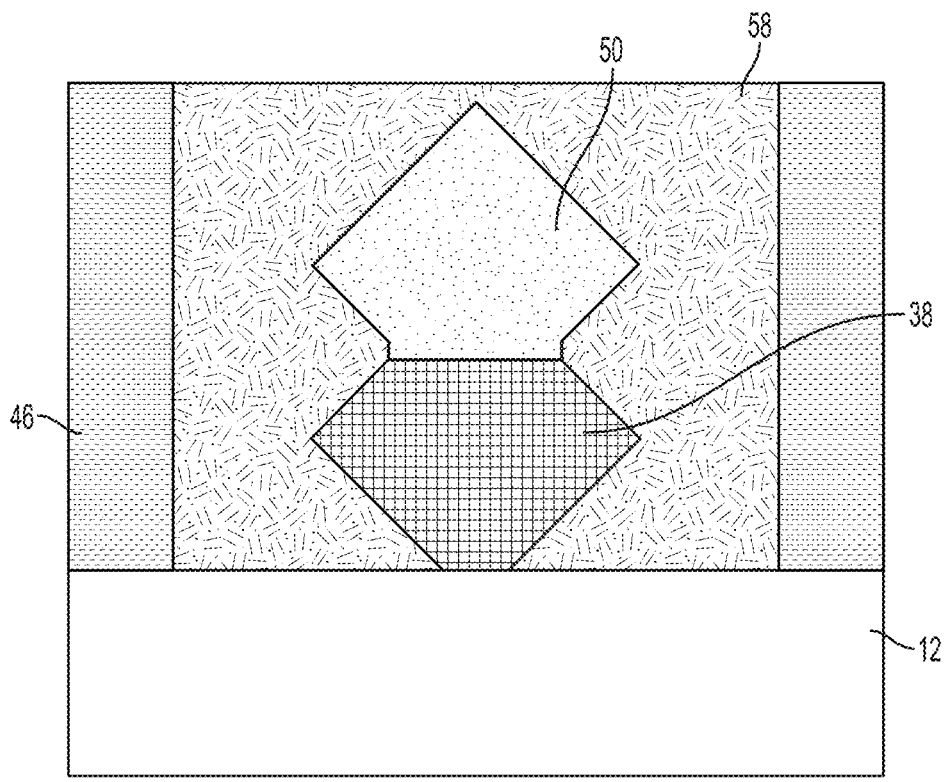
FIG. 13B depicts a cross-sectional view of the semiconductor device of FIG. 13A taken along line A-A.

In FIGS. 13A and 13B, a first liner 58 has been deposited into the source and drain trenches 56, forming an intermediate device 15, which is the common drain for the formed pFET and nFET. The drain of the nFET and the pFEt are connected by silicide materials. The liner 58 can be formed from a metal material such as tungsten (W), aluminum (Al), or copper (Cu). One or more CMP processes can be performed to remove excess portions of the first liner 58.

Figures 14A, 14B:
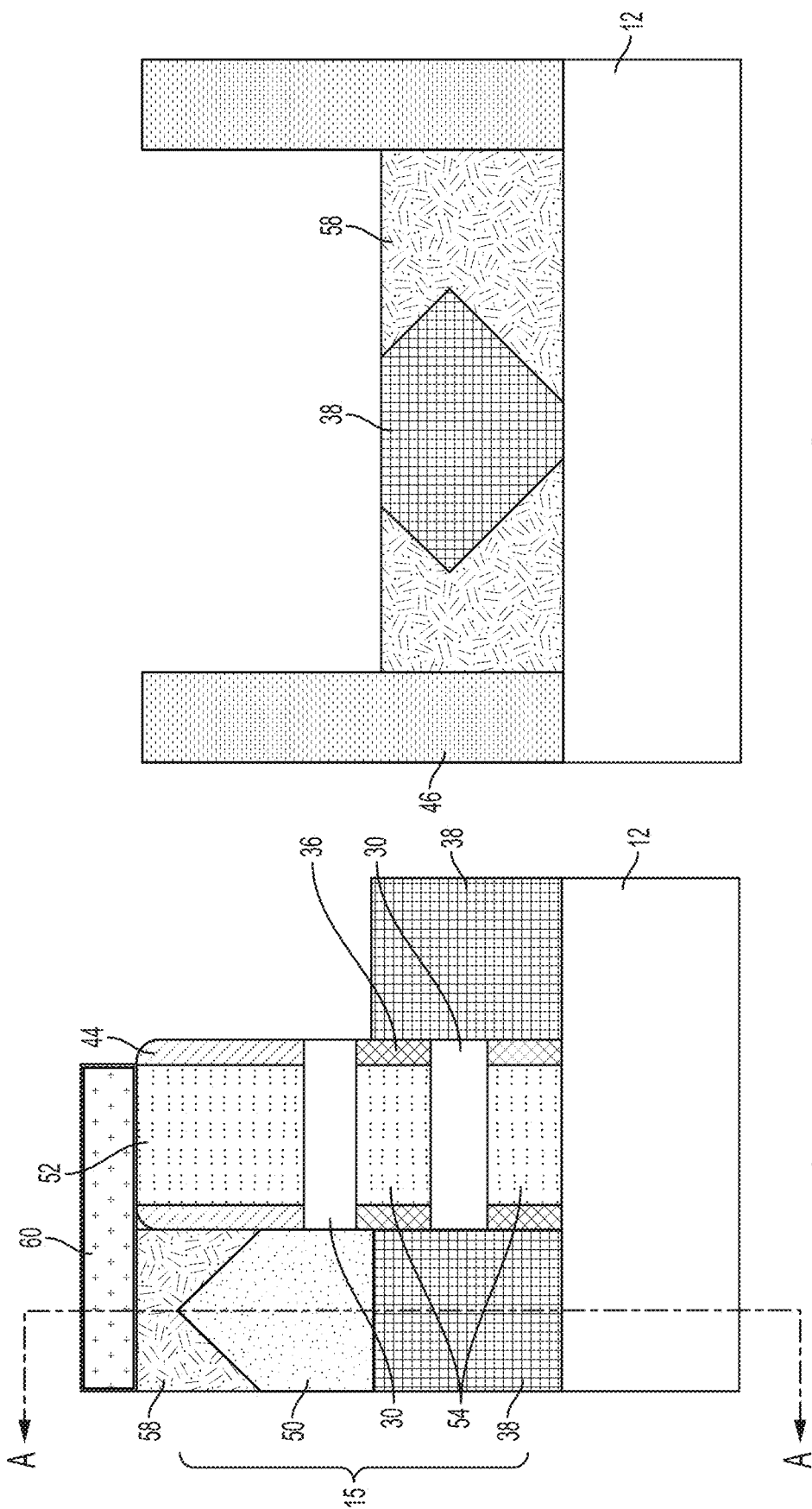
FIG. 14A depicts cross-sectional view of the semiconductor device after the formation of a mask on a portion of the device and partial metal recess and second epitaxy layer removal on one side of the FETs S/D.
FIG. 14B depicts a cross-sectional view of the semiconductor device of FIG. 14A taken along line A-A.

In FIGS. 14A and 14B, a mask 60 is formed over the intermediate device 15 to protect the structure during nFET sacrificial source epi recess formation. A partial first liner 58 recess is also performed together with the removal of the second epitaxial layer 50 to open the source part.

Figures 15A, 15B:
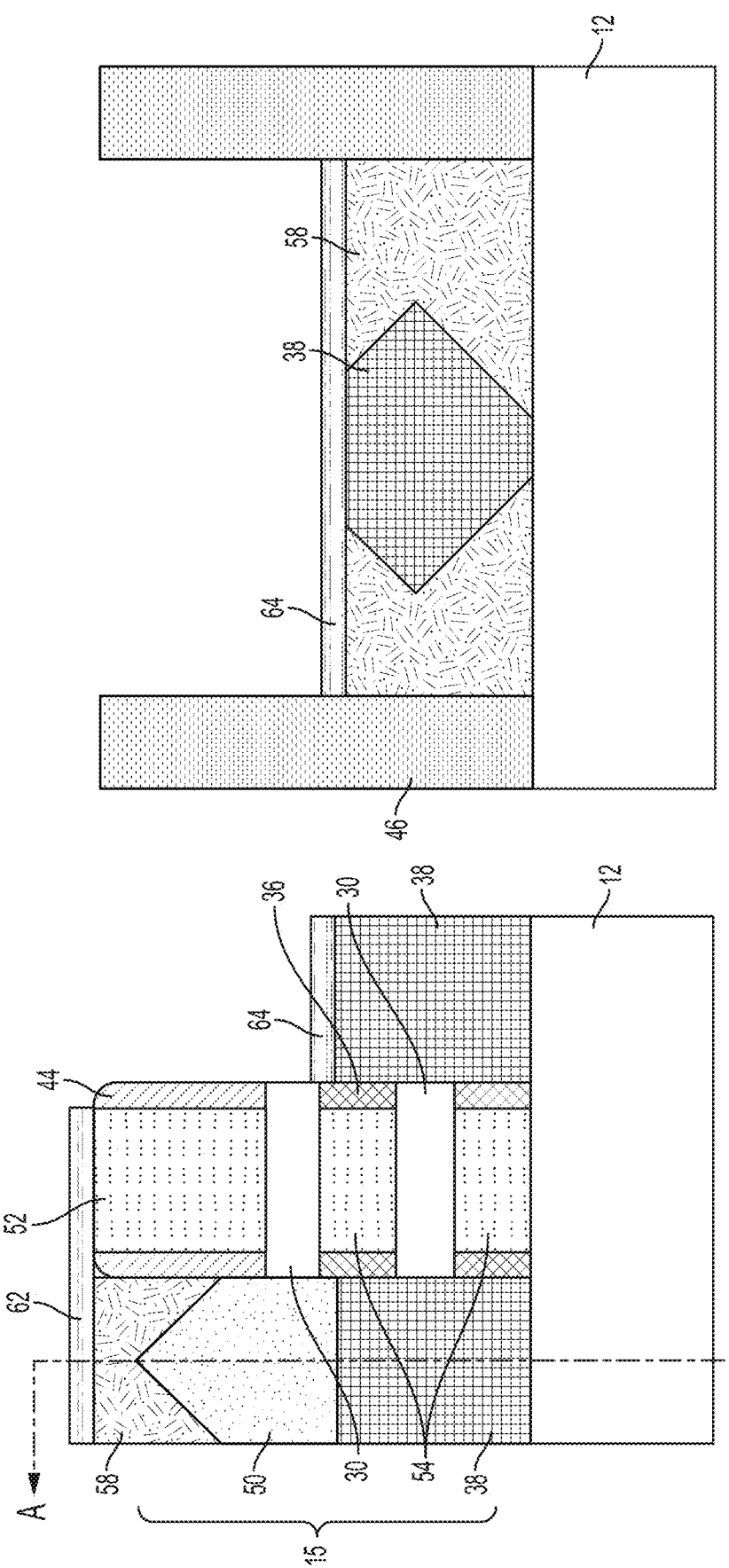
FIG. 15A depicts cross-sectional view of the semiconductor device after the deposition of an insulator layer.
FIG. 15B depicts a cross-sectional view of the semiconductor device of FIG. 15A taken along line A-A.

In FIGS. 15A and 15B, a directional deposition has been used to deposit a first insulator layer 62 over the intermediate device 15 and a second insulator layer 64 occurs over the exposed second epitaxial layer 38. The insulator layers 62, 64 can be formed from various nitride materials including, but not limited to, silicon nitride (SiN).

In FIGS. 16A and 16B, the second epitaxial layer 50 is regrown (from the nFET nanosheet channel) on the second insulator layer 64 in preparation for forming an nFET source epi 17.

Figure 17A:
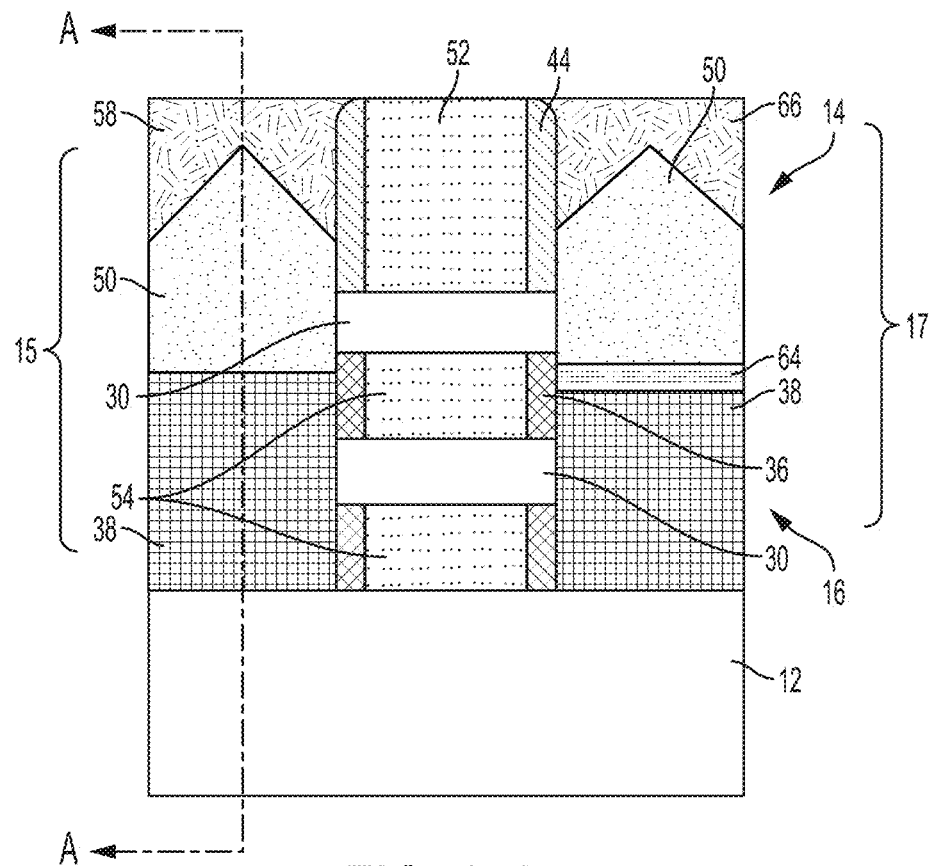
FIG. 17A depicts cross-sectional view of the semiconductor device after another metal deposition.
Figure 17B:
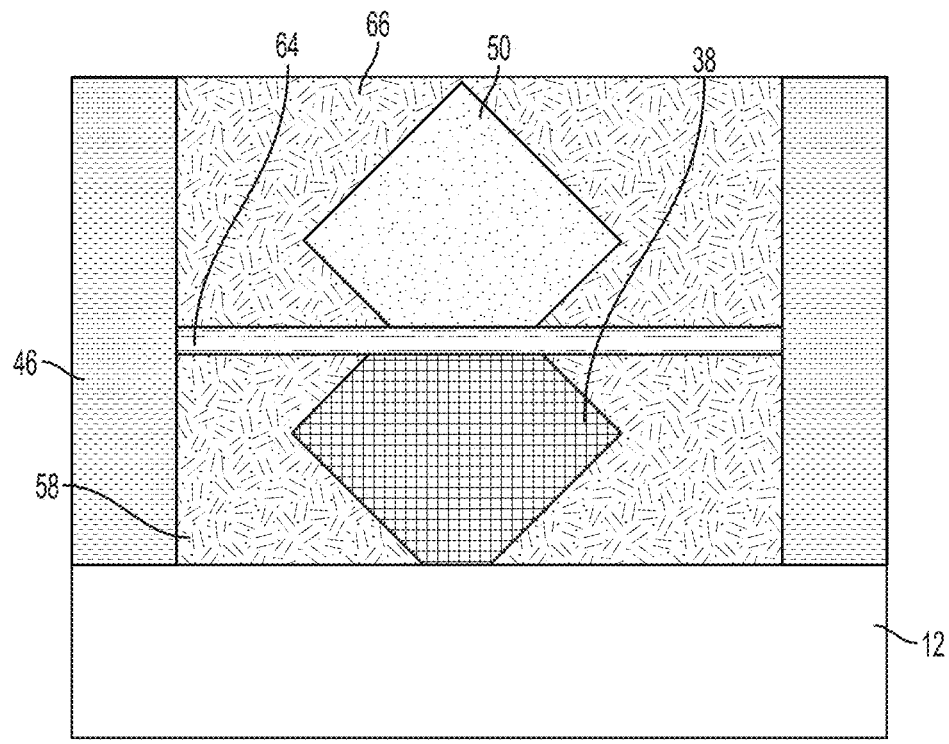
FIG. 17B depicts a cross-sectional view of the semiconductor device of FIG. 17A taken along line A-A.

FIGS. 17A and 17B show the formation of a top nFET source contact where a second liner 66 is deposited around the second epitaxial layer 50 and the second insulator layer 64, forming the nFET source epi 17. The liner material can include a metal material such as tungsten (W), aluminum (Al), or copper (Cu). One or more CMP processes (not shown) can be performed to remove excess portions of the second liner 66 after which the pFET 14 and nFET 16 are formed.

As described herein, various non-limiting embodiments of the invention provide a semiconductor device including vertically stack pFETs and nFET to reduce the overall area space of the semiconductor device. In the various embodiments, the drain of the nFET and the drain of the pFET are electrically connected, while the source of the nFET and the source of the pFET are electrically isolated. Such connections are needed in order to form a complementary metal oxide semiconductor (CMOS) inverter. Such connections or disconnections allow for lateral transport of current across the device. In a stacked nanosheet semiconductor device as disclosed herein, the area is reduced by at least 50% as compared to a semiconductor device without vertical stacking of the pFET and nFET.

Aspects of the present invention are described herein with reference to flowchart illustrations and/or block diagrams of methods, and apparatus (devices) products according to embodiments of the invention. The flowchart and block diagrams in the Figures illustrate the architecture, functionality, and operation of possible implementations of the device and method of fabricating the device according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

Figure 18:
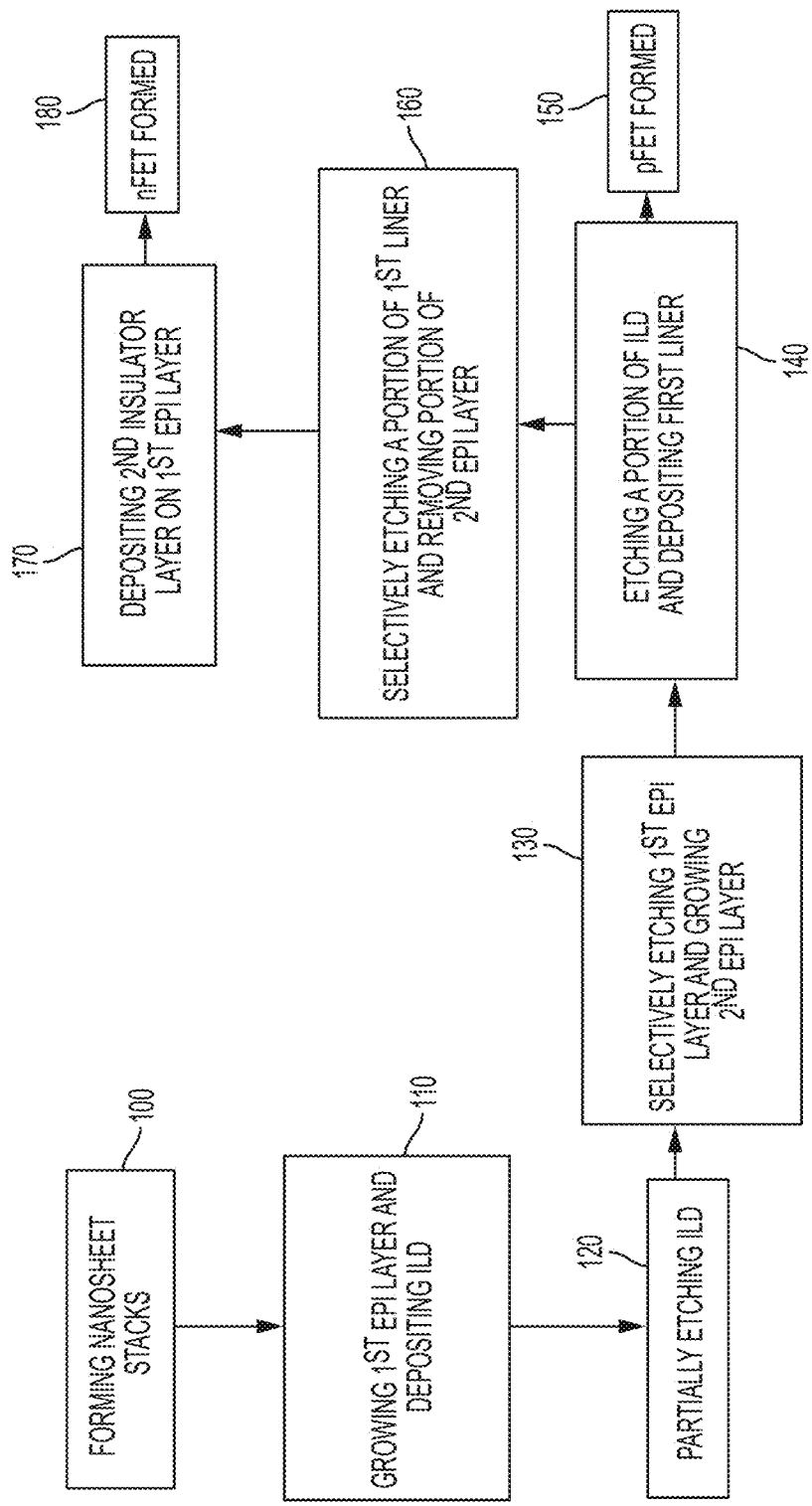
FIG. 18 depicts a flow diagram illustrating a method according to one or more embodiments of the invention; and The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

A method of forming the semiconductor device is shown in FIG. 18 where nanosheet stacks are formed that include alternate silicon layers and silicon germanium layers on a substrate at 100. A first epitaxial layer ($1^{st}$ epi) is grown on a source and drain and an interlayer dielectric (ILD) is deposited on the first epitaxial layer at 110. The ILD is partially etched to expose a portion of the first epitaxial layer at 120. A portion of the first epitaxial layer is selectively etched and a second epitaxial layer ($2^{nd}$ epi) is grown on the first epitaxial layer at 130. At 140, a portion of the interlayer dielectric is etched and a first liner is deposited in a recess left by the etching with the pFET formed at 150. A portion of the first liner is selectively etched and a portion of the second epitaxial layer is selectively removed leaving a portion of the first epitaxial layer exposed at 160. At 170, a second insulator layer is deposited on the first epitaxial layer so that the nFET is formed at 180. The pFET and the nFET are disposed vertically adjacent to one another.

Forming the nanosheet stacks can further include forming inner spacers on the silicon germanium layers of the nanosheet stacks and refilling the interlayer dielectric and replacing the gate structure with a gate replacement structure. The method can further include depositing a first insulator layer on the pFET and depositing a second insulator layer on the exposed portion of the first epitaxial layer and selectively growing the second epitaxial layer on the second insulator layer. In this embodiment, the pFET and the nFET are disposed vertically adjacent to one another and separated by the second insulator layer. In a non-limiting embodiment, partially etching the interlayer dielectric is completed with reactive ion etching.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A nanosheet semiconductor device, comprising:
a pFET; and
an nFET;
wherein the pFET and the nFET are disposed vertically adjacent to one another, wherein a drain of the pFET and a drain of the nFET are electrically connected; and
wherein the drain of the nFET is formed directly on a surface of the drain of the pFET.

2. The nanosheet semiconductor device of claim 1, wherein the pFET and the nFET each comprise a source, wherein the source of the pFET and the source of nFET are electrically isolated from one another.

3. The nanosheet semiconductor device of claim 1, wherein a current is transported laterally through the nanosheet semiconductor device.

4. The nanosheet semiconductor device of claim 1, wherein the pFET and the nFET share a gate.

5. The nanosheet semiconductor device of claim 1, further comprising an insulator layer disposed between the pFET and the nFET.

6. The nanosheet semiconductor device of claim 1, further comprising at least two epitaxial layers, wherein the epitaxial layers comprise the same or different materials.

7. The nanosheet semiconductor device of claim 6, where the epitaxial layers comprising silicon, silicon germanium, pure silicon, silicon epitaxy with in-situ P doping, or a combination comprising at least one of the foregoing.

8. The nanosheet semiconductor device of claim 1, wherein an area of the nanosheet semiconductor device is reduced by at least 40% as compared to a semiconductor device without vertical stacking of the pFET and nFET.

9. The nanosheet semiconductor device of claim 8, wherein the area is reduced by at least 50% as compared to a semiconductor device without vertical stacking of the pFET and nFET.

10. A method of operating a nanosheet semiconductor device, the method comprising:
transporting a current laterally through the nanosheet semiconductor device;
wherein a pFET and an nFET of the nanosheet semiconductor device are disposed vertically adjacent to one another, and a drain of the pFET and a drain of the nFET are electrically connected; and
wherein the nanosheet semiconductor device comprises at least two stacked epitaxial layers, wherein the stacked epitaxial layers comprise different materials, and wherein the stacked epitaxial layers define the drain of the pFET and the drain of the nFET.

11. The method of claim 10 further comprising a shared gate positioned over the pFET and the nFET.

12. The method of claim 10, further comprising an insulator layer disposed between a first source of the pFET and a second source of the nFET.

13. The method of claim 10, where the epitaxial layers comprise silicon, silicon germanium, pure silicon, silicon epitaxy with in-situ P doping, or a combination comprising at least one of the foregoing.

14. A nanosheet semiconductor device, comprising:
 a pFET comprising a first nanowire, a first source, and a first drain;
 an nFET comprising a second nanowire, a second source, and a second drain, the second nanowire vertically stacked over the first nanowire; and
 a shared gate formed over a channel region of the first nanowire and the second nanowire;
 wherein the second drain is formed directly on a surface of the first drain; and
 wherein the second source is electrically isolated from the first source.

15. The nanosheet semiconductor device of claim 14, wherein a current is transported laterally through the nanosheet semiconductor device.

16. The nanosheet semiconductor device of claim 14 further comprising an insulator layer disposed between the first source of the pFET and the second source of the nFET.

17. The nanosheet semiconductor device of claim 14, wherein the first drain and the second drain each comprise silicon, silicon germanium, pure silicon, silicon epitaxy with in-situ P doping, or a combination comprising at least one of the foregoing.

18. The nanosheet semiconductor device of claim 14, wherein an area of the nanosheet semiconductor device is reduced by at least 40% as compared to a semiconductor device without vertical stacking of the pFET and nFET.

19. The nanosheet semiconductor device of claim 18, wherein the area is reduced by at least 50% as compared to a semiconductor device without vertical stacking of the pFET and nFET.

\* \* \* \* \*